US008065647B2

(12) United States Patent
Stevens

(10) Patent No.: US 8,065,647 B2
(45) Date of Patent: Nov. 22, 2011

(54) METHOD AND SYSTEM FOR ASYNCHRONOUS CHIP DESIGN

(75) Inventor: Kenneth S. Stevens, Brighton, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 484 days.

(21) Appl. No.: 12/253,489

(22) Filed: Oct. 17, 2008

(65) Prior Publication Data

US 2009/0106719 A1  Apr. 23, 2009

Related U.S. Application Data

(60) Provisional application No. 60/981,311, filed on Oct. 19, 2007.

(51) Int. Cl.
*G06F 17/50* (2006.01)
(52) U.S. Cl. ......... 716/113; 716/100; 716/108; 716/134
(58) Field of Classification Search .............. 716/100, 716/108, 113, 114
See application file for complete search history.

(56) References Cited

U.S. PATENT DOCUMENTS

| | | | |
|---|---|---|---|
| 5,418,825 A * | 5/1995 | Cantrell et al. ............... 377/48 |
| 6,049,882 A | 4/2000 | Paver | |
| 6,065,126 A | 5/2000 | Tran et al. | |
| 6,099,579 A | 8/2000 | Dowling et al. | |
| 6,182,233 B1 * | 1/2001 | Schuster et al. ............ 713/400 |
| 6,557,161 B2 | 4/2003 | Jones | |
| 6,622,273 B1 | 9/2003 | Barnes | |
| 6,848,060 B2 * | 1/2005 | Cook et al. ................. 713/400 |
| 6,949,954 B2 | 9/2005 | Nystrom et al. | |
| 6,958,627 B2 | 10/2005 | Singh et al. | |
| 7,089,443 B2 | 8/2006 | Albonesi et al. | |
| 7,095,251 B2 | 8/2006 | Wilcox et al. | |
| 7,307,450 B2 | 12/2007 | Liang et al. | |
| 7,308,593 B2 | 12/2007 | Jacobson et al. | |
| 7,418,676 B2 | 8/2008 | Karaki et al. | |
| 2006/0242386 A1 | 10/2006 | Wood | |

OTHER PUBLICATIONS

Lu et al. "High Level Fault Modeling of Asynchronous Circuits", Apr. 1995, Proceedings, 13$^{th}$ IEEE VLSI Test Symposium, pp. 190-195.*

Jacobs et al. "A Fully Asynchronous Digital Signal Processor Using Self-Timed Circuits", Dec. 1990, IEEE Journal of Solid-State Circuits, vol. 25, issue 6, pp. 1526-1537.*

Kawokgy et al. "A Low-Power CSCD Asynchronous Viterbi Decoder for Wireless Applications", Aug. 2007, ACM/IEEE International Symposium on Low Power Electronics and Design, Technical Digest, pp. 363-366.*

Babighian, P., et al., "A Scalable Algorithm for RTL Insertion of Gated Clocks Based on ODCs Computation", IEEE Transactions on Computer-Aided Design of Integrated Circuits and Systems, vol. 24, Issue 1, Jan. 2005, pp. 29-42.

(Continued)

*Primary Examiner* — Sun Lin

(74) *Attorney, Agent, or Firm* — Foley & Lardner LLP

(57) ABSTRACT

A method of designing an asynchronous integrated circuit is provided. A global clock network of a synchronous circuit is replaced with a plurality of handshaking circuits. Data validity is encoded into a communication path between a first pipeline stage and a second pipeline stage of the synchronous circuit. A control logic for the first pipeline stage is implemented using a template that contains characterization information for timing to generate an asynchronous circuit design.

18 Claims, 21 Drawing Sheets

OTHER PUBLICATIONS

Berkel, et al., "A Fully Asynchronous Low-Power Error Corrector for the DCC Player," IEEE Journal of Solid-State Circuits, vol. 29. No. 12., pp. 1429-1439., Dec. 1994.

Zhu, et al., "A Single-Rail Handshake CDMA Correlator,"Electronics, Circuits and Systems, 2002. 9th International Conference on Electronic Circuits and Systems, vol. 2, pp. 505-508, Sep. 15-18, 2002.

Liu, et al., "Asynchronous Computing in Sense Amplifier-based Pass Transistor Logic," Asynchronous Circuits and Systems, 2008. ASYNC '08. 14th IEEE International Symposium on Asynchronous Circuits and Systems, pp. 105-115, Apr. 7-10, 2008.

Shang, et al., "Asynchronous Functional Coupling for Low Power Sensor Network Processors," Integrated Circuit and System Design Power and Timing Modeling, Optimization and Simulation, vol. 4644/2007 pp. 53-63, Sep. 3-5, 2007.

Cortadella, et al., "Desynchronization: Synthesis of Asynchronous Circuits From Synchronous Specifications," IEEE Transactions on Computer-Aided Design of Integrated Circuits and Systems, vol. 25, No. 10, pp. 1904-1921, Oct. 2006.

Ogg, et al., "Serialized Asynchronous Links for NoC," Proceedings of the conference on Design, automation and test in Europe, Munich, Germany., pp. 1003-1008, Mar. 10-14, 2008.

Kessels, et al. "The Tangram Framework," Proceedings of the 2001 conference on Asia South Pacific design automation, Yokohama, Japan., pp. 255-260, Jan. 30-Feb. 2, 2001.

* cited by examiner $$\text{LEFT} = \overline{lr}.\overline{c1}.la.\overline{c2}.lr.la.\text{LEFT} \quad \underline{600}$$
$$\text{RIGHT} = c1.\overline{rr}.c2.ra.rr.ra.\text{RIGHT}$$
$$\text{SPEC} = (\text{LEFT} \mid \text{RIGHT}) \setminus \{c1, c2\}$$

Fig. 6

```
module linear_control (lr, la, rr, ra, ck, rst);
  input     lr, ra, rst;
  output    la, rr, ck;

AOI32X1TS  lc0  (.A1(lr), .A2(ra_), .A3(y_), .B1(lr), .B2(la), .Y(la_));
  AOI32X1TS  lc1  (.A1(lr), .A2(ra_), .A3(y_), .B1(ra_), .B2(rr), .Y(rr_));
  NOR2X1TS   lc2  (.A1(la), .A2(rr), .Y(y_));
  INVX1TS    lc3  (.A1(la_), .Y(la));
  NOR2X1TS   lc4  (.A1(rst), .A2(rr_), .Y(rr));
  INVX1TS    lc5  (.I(ra), .Y(ra_));

endmodule // linear_control
```

```
set_size_only -all_instances [ find -hier cell *lc0 ]
set_size_only -all_instances [ find -hier cell *lc1 ]
set_size_only -all_instances [ find -hier cell *lc2 ]
set_size_only -all_instances [ find -hier cell *lc3 ]
set_size_only -all_instances [ find -hier cell *lc4 ]
set_size_only -all_instances [ find -hier cell *lc5 ]
```

Fig. 9 breaking local cycles:

set_disable_timing -from A3 -to Y [find -hier cell *lc0]
set_disable_timing -from B2 -to Y [find -hier cell *lc0]
set_disable_timing -from A3 -to Y [find -hier cell *lc1]
set_disable_timing -from B2 -to Y [find -hier cell *lc1]

1000

Fig. 10 breaking handshake protocol cycles:

This breaks transitions from ra to lr in the complex gate:
set_disable_timing -from A2 -to Y [find -hier cell *lc0]
This breaks transitions from ra to rr in the complex gate:
set_disable_timing -from A2 -to Y [find -hier cell *lc1]
set_disable_timing -from B1 -to Y [find -hier cell *lc1]

1200 key timing driven constraints:

set_data_check -fall_from */lc0/A3 -rise_to */lc0/B2 -setup $race_margin
set_data_check -fall_from */lc1/A3 -rise_to */lc1/B2 -setup $race_margin

Fig. 13

1300 external protocol constraints:

set_data_check -fall_from */lc0/A2 -rise_to */lc0/B2 -setup 0
set_data_check -fall_from */lc1/A1 -rise_to */lc1/B2 -setup 0
set_data_check -fall_from */lc2/A1 -fall_to */lc2/Y -setup 0
set_data_check -fall_from */lc2/A2 -fall_to */lc2/Y -setup 0

Fig. 14

1400 wire fork constraints:

set_data_check -rise_from */lc1/A3 -fall_to */lc1/A1 -setup 0
set_data_check -rise_from */lc0/A3 -fall_to */lc0/A2 -setup 0
set_data_check -fall_from */lc5/I -fall_to */lc5/Y -setup 0

Fig. 15

```
1500
report_timing -delay max -rise_to */lc0/B2
report_timing -delay max -rise_to */lc1/B2
report_timing -delay max -fall_to */lc2/Y
report_timing -delay max -fall_to */lc1/A1
report_timing -delay max -fall_to */lc0/A2
report_timing -delay max -fall_to */lc5/Y
```

A binary relation $\mathcal{LC} \subseteq \mathcal{P} \times \mathcal{P}$ over agents is a logic conformation between implementation $I$ and specification $S$ if $(I, S) \in \mathcal{LC}$ then $\forall \alpha \in \mathcal{A}_{CI}$ and $\forall \beta \in \overline{\mathcal{A}} \cup \{\tau\}$ (outputs and $\tau$) and $\forall \gamma \in \mathcal{A}$ (inputs)

(i) Whenever $S \xrightarrow{\alpha} S'$ then
$\exists I'$ such that $I \stackrel{\hat{\alpha}}{\Longrightarrow} I'$ and $(I', S') \in \mathcal{LC}$ (ii) Whenever $I \xrightarrow{\beta} I'$ then
$\exists S'$ such that $S \stackrel{\hat{\beta}}{\Longrightarrow} S'$ and $(I', S') \in \mathcal{LC}$ (iii) Whenever $I \xrightarrow{\gamma} I'$ then
$\exists S'$ such that $S \stackrel{\gamma}{\Longrightarrow} S'$ and $(I', S') \in \mathcal{LC}$

Fig. 24

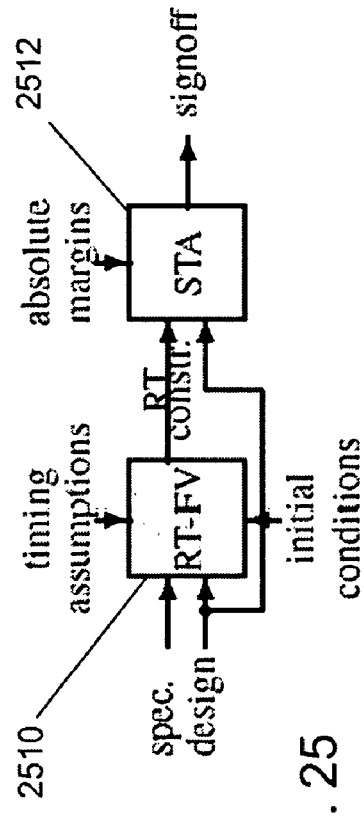

Fig. 25

Latch timing constraints:

set_max_delay $clk_period -from R0_reg/q -to R1_reg/d
set_min_delay $req_del_min -rise_from p0/lr -rise_to p1/lr
set_max_delay $req_del_max -rise_from p0/lr -rise_to p1/rr

Timed protocol constraints:

set_data_check -fall_from p0/lc0/A2 -rise_to p0/lc0/B2 -setup $race_margin
set_data_check -fall_from p0/lc1/A1 -rise_to p0/lc1/B2 -setup $race_margin

2600

Fig. 26

METHOD AND SYSTEM FOR ASYNCHRONOUS CHIP DESIGN

CROSS-REFERENCE TO RELATED PATENT APPLICATION

This application claims the benefit of U.S. Provisional Application Ser. No. 60/981,311, filed Oct. 19, 2007, which is incorporated herein by reference in its entirety.

BACKGROUND

As the system on a chip becomes faster and larger, it is becoming increasingly difficult to distribute the clock to the entire chip because of clock skew. To achieve a low skew clock distribution, low skew drivers are used which are extremely power hungry. Asynchronous circuits may provide a solution for this problem.

A system is asynchronous if a clock is not used for sequencing actions such that inputs and outputs can change at any time. The chief difficulty in asynchronous design is knowing when a specific computation is complete. However, a major advantage of asynchronous design over synchronous designs is that asynchronous designs dissipate substantially less power than synchronous designs because asynchronous circuits only dissipate power when actively computing instead of for each clock cycle. Thus, less power is used because there is less switching.

Additionally, skew is also not an issue for asynchronous circuits because there is no common clock. Asynchronous circuits are also modular and exhibit average case performance instead of worst case as is the case for synchronous circuits. Asynchronous circuits also exhibit dramatic improvements in terms of electro-magnetic interference and are inherently closed loop making them more robust in the presence of process, voltage, and temperature variations.

Asynchronous design has shown substantial power and performance benefits but is in practice difficult to implement due to the protocol and sequential, rather than combinational, nature of its design. Revolutionary means of designing these chips has largely failed to gain wide spread industry acceptance. Asynchronous designs have been avoided because they are difficult to implement and difficult to test. In general, there is a lack of good computer aided design (CAD) tools that completely cover the design flow for asynchronous circuits.

Desynchronization is an evolutionary means of creating asynchronous designs from clocked circuit design largely using the traditional clocked CAD. In this design style, the clock distribution network is removed and replaced with asynchronous handshake protocols and circuitry. Current means of implementing desynchronization use a static marked graph handshake and token marking with no choice. The handshake protocol guarantees correctness of the clock distribution network but carries no information about data validity. This results in circuits that behave very much like a clocked design, but with a performance and power penalty.

SUMMARY

In an exemplary embodiment, a method for designing an asynchronous integrated circuit is provided. A global clock network of a synchronous circuit is replaced with a plurality of handshaking circuits. Data validity is encoded into a communication path between a first pipeline stage and a second pipeline stage of the synchronous circuit. A control logic for the first pipeline stage is implemented using a template that contains characterization information for timing to generate an asynchronous circuit design.

In another exemplary embodiment, a computer-readable medium is provided comprising computer-readable instructions that, upon execution by a processor, cause the processor to perform the operations of the method of designing an asynchronous integrated circuit.

In yet another exemplary embodiment, a system is provided. The system includes, but is not limited to, a processor and the computer-readable medium operably coupled to the processor. The computer-readable medium comprises instructions that, upon execution by the processor, perform the operations of the method of designing an asynchronous integrated circuit.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

FIG. 6 depicts an efficient linear pipeline controller in accordance with an exemplary embodiment.

FIG. 8 depicts a Verilog implementation of a linear controller template using a 130 nanometer Artisan Library in accordance with an exemplary embodiment.

FIG. 9 depicts a size only constraint of the linear controller of FIG. 6 in accordance with an exemplary embodiment.

FIG. 10 depicts a local break loop constraint of the linear controller of FIG. 6 in accordance with an exemplary embodiment.

FIG. 11 depicts a handshake protocol break loop constraint of the linear controller of FIG. 6 in accordance with an exemplary embodiment.

FIG. 12 depicts timing constraints of the linear controller of FIG. 6 in accordance with an exemplary embodiment.

FIG. 13 depicts external protocol constraints of the linear controller of FIG. 6 in accordance with an exemplary embodiment.

FIG. 14 depicts wire fork constraints of the linear controller of FIG. 6 in accordance With an exemplary embodiment.

FIG. 15 depicts report statements to validate the timing constraints of FIGS. 12-14 in accordance with an exemplary embodiment.

FIG. 24 depicts a bisimilar logic conformance relationship for relative timing generation in accordance with an exemplary embodiment.

FIG. 25 depicts formal relative timing generation and mapping to static timing analysis tools in accordance with an exemplary embodiment.

FIG. 26 depicts protocol level constraints for the linear control template in accordance with an exemplary embodiment.

DETAILED DESCRIPTION

Figure 1:
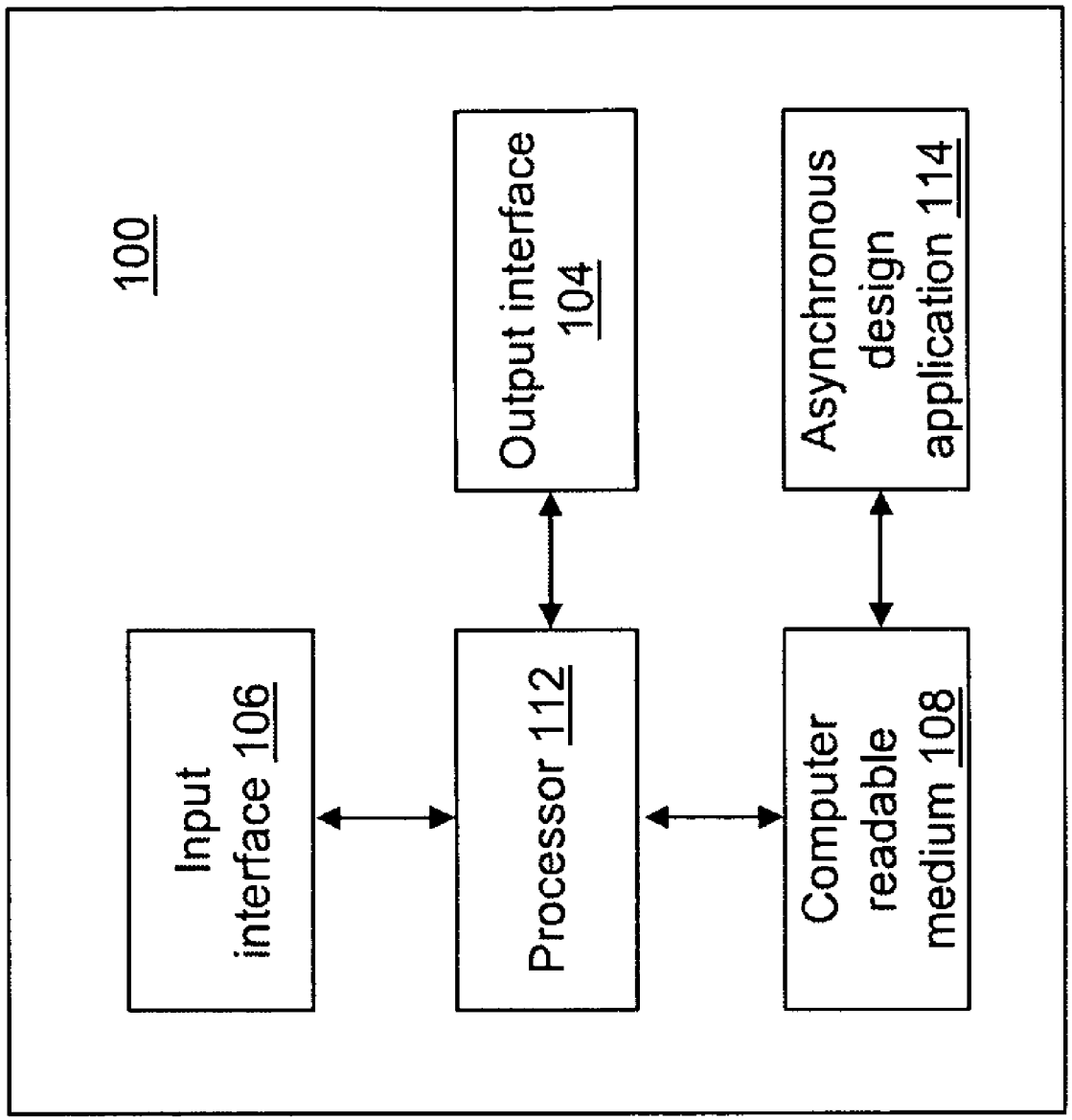
FIG. 1 depicts a block diagram of an asynchronous design system in accordance with an exemplary embodiment.

Referring to FIG. 1, a block diagram of an asynchronous design system 100 is shown in accordance with an exemplary embodiment. Asynchronous design system 100 may include a computing device of any form factor. Asynchronous design system 100 may include a output interface 104, an input interface 106, a computer-readable medium 108, a processor 112, and an asynchronous design application 114. Different and additional components may be incorporated into asynchronous design system 100.

Output interface 104 provides an interface for outputting information for review by a user of 3-D mesh formation system 100. For example, output interface 104 may include an interface to a display, a printer, a speaker, etc. The display may be a thin film transistor display, a light emitting diode display, a liquid crystal display, or any of a variety of different displays known to those skilled in the art. The printer may be any of a variety of printers as known to those skilled in the art. The speaker may be any of a variety of speakers as known to those skilled in the art. Asynchronous design system 100 may have one or more output interfaces that use the same or a different interface technology.

Input interface 106 provides an interface for receiving information from the user for entry into asynchronous design system 100 as known to those skilled in the art. Input interface 106 may use various input technologies including, but not limited to, a keyboard, a pen and touch screen, a mouse, a track ball, a touch screen, a keypad, one or more buttons, etc. to allow the user to enter Information into asynchronous design system 100 or to make selections presented In a user interface displayed on output interface 104. Input interface 106 may provide both an input and an output interface. For example, a touch screen both allows user input and presents output to the user.

Computer-readable medium 108 is an electronic holding place or storage for information so that the information can be accessed by processor 112 as known to those skilled in the art. Computer-readable medium 108 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disk (CD), digital versatile disk (DVD), . . . ), smart cards, flash memory devices, etc. Asynchronous design system 100 may have one or more computer-readable media that use the same or a different memory media technology. Asynchronous design system 100 also may have one or more drives that support the loading of a memory media such as a CD or DVD.

Processor 112 executes instructions as known to those skilled in the art. The instructions may be carried out by a special purpose computer, logic circuits, or hardware circuits. Thus, processor 112 may be implemented in hardware, firmware, software, or any combination of these methods. The term "execution" is the process of running an application or the carrying out of the operation called for by an instruction. The instructions may be written using one or more programming language, scripting language, assembly language, etc. Processor 112 executes an instruction, meaning that it performs the operations called for by that instruction. Processor 112 operably couples with output interface 104, with input interface 106, and with memory 108 to receive, to send, and to process information. Processor 112 may retrieve a set of instructions from a permanent memory device and copy the instructions in an executable form to a temporary memory device that is generally some form of RAM. Asynchronous design system 100 may include a plurality of processors that use the same or a different processing technology.

Asynchronous design application 114 performs operations associated with designing an asynchronous integrated circuit. Some or all of the operations described may be embodied in asynchronous design application 114. The operations may be implemented using hardware, firmware, software, or any combination of these methods. With reference to the exemplary embodiment of FIG. 1, asynchronous design application 114 is implemented in software stored in computer-readable medium 108 and accessible by processor 112 for execution of the instructions that embody the operations of asynchronous design application 114. Asynchronous design application 114 may be written using one or more programming languages, assembly languages, scripting languages, etc.

Figure 2:
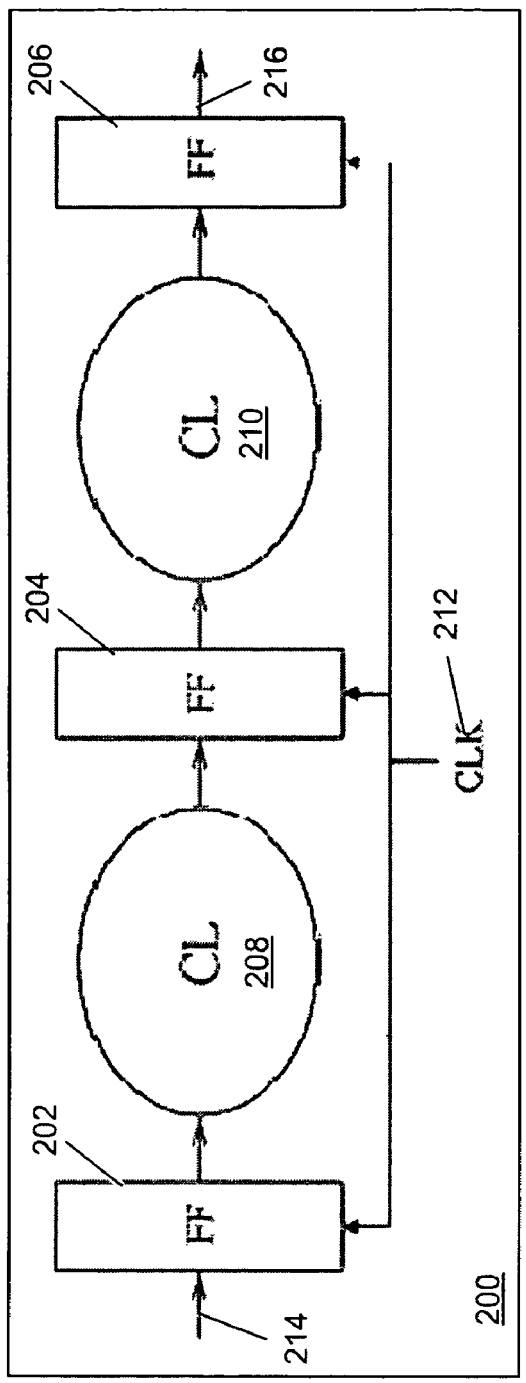
FIG. 2 depicts a synchronous pipeline in accordance with an exemplary embodiment.

Desynchronization is the process of applying asynchronous design techniques to a clocked circuit. For example, referring to FIG. 2, a clocked circuit 200 is shown. Clocked circuit 200 includes a first register 202, a second register 204, a third register 206, a first combinational logic 208, a second combinational logic 210, and a clock 212. First register 202 accepts an input 214 and third register 206 outputs an output 216. The output of the first register 202 is presented to the input of the first combinational logic 208 and a result is produced at the output of the first combinational logic 208. When a clock event, such as a rising edge, occurs, the second register 204 captures the result produced by the first combinational logic 208. Likewise, the output of the second register 204 is presented to the input of the second combinational logic 210 and a result is produced at the output of the second combinational logic 210. When a clock event, such as a rising edge, occurs, the third register 206 captures the result produced by the second combinational logic 210.

Figure 3:
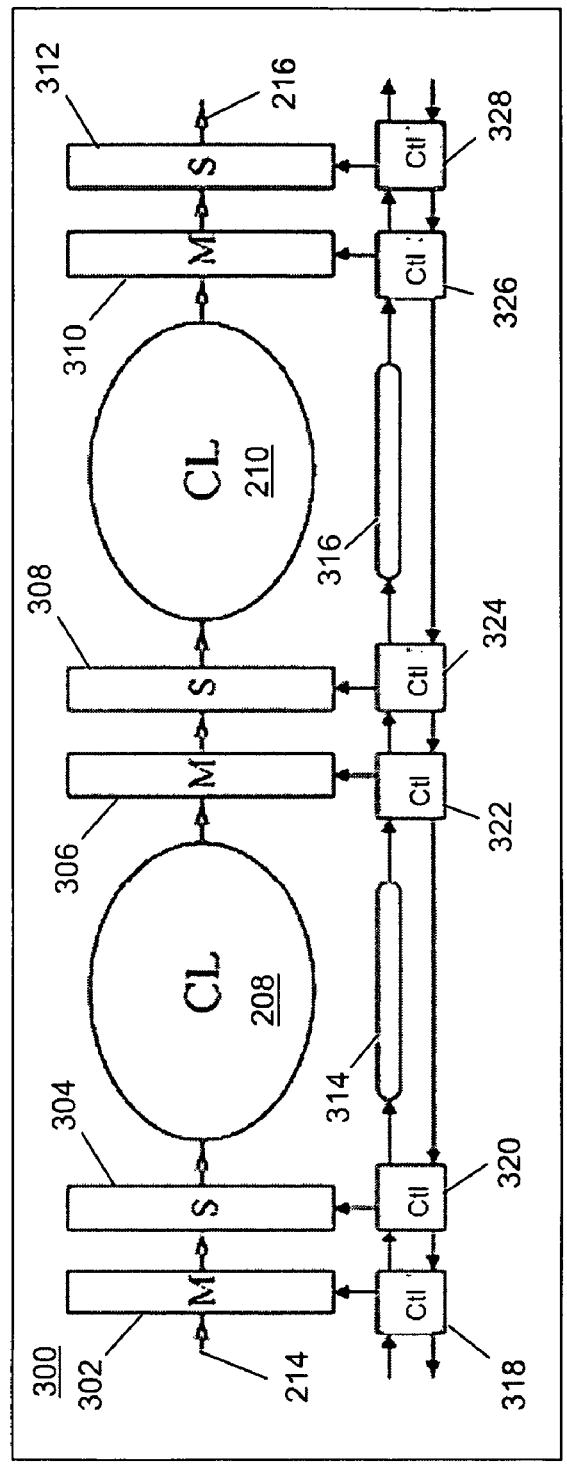
FIG. 3 depicts a desynchronized pipeline in accordance with an exemplary embodiment.

Referring to FIG. 3, a desynchronized circuit 300 based on clocked circuit 200 is shown in accordance with an exemplary embodiment. In desynchronized circuit 300, first register 202 is replaced with first master 302 and slave 304 latches, second register 204 is replaced with second master 306 and slave 308 latches, and third register 206 is replaced with third master 310 and slave 312 latches. In alternative embodiments, first register 202, second register 204, and third register 206 can be replaced with other types of latches, or not replaced and used as the pipeline memory. A first local controller 318, a second local controller 320, a third local controller 322, a fourth local controller 324, a fifth local controller 326, and a sixth local controller 328 control first master 302 and slave 304 latches, second master 306 and slave 308 latches, and third master 310 and slave 312 latches, respectively. The controllers use handshaking enabled by the matched delays to control the flow of data so that new data is presented to the combinational logic only when the combinational logic is ready to process new data. Clock 212 is decoupled from the master and slave latches. A first matched delay 314 and second matched delay 316 are placed in parallel with first combinational logic 208 and second combinational logic 210. The combination of first matched delay 314 and second matched delay 316 and the delay through second local controller 320, third local controller 322, fourth local controller 324, and fifth local controller 326 is greater than or equal to the delay of the critical path of the corresponding combinational block. Each matched delay serves as a completion detector for the corresponding combinational block and ensures that the data reaches the latch/register before the control signal (bundled data constraint).

Figure 4:
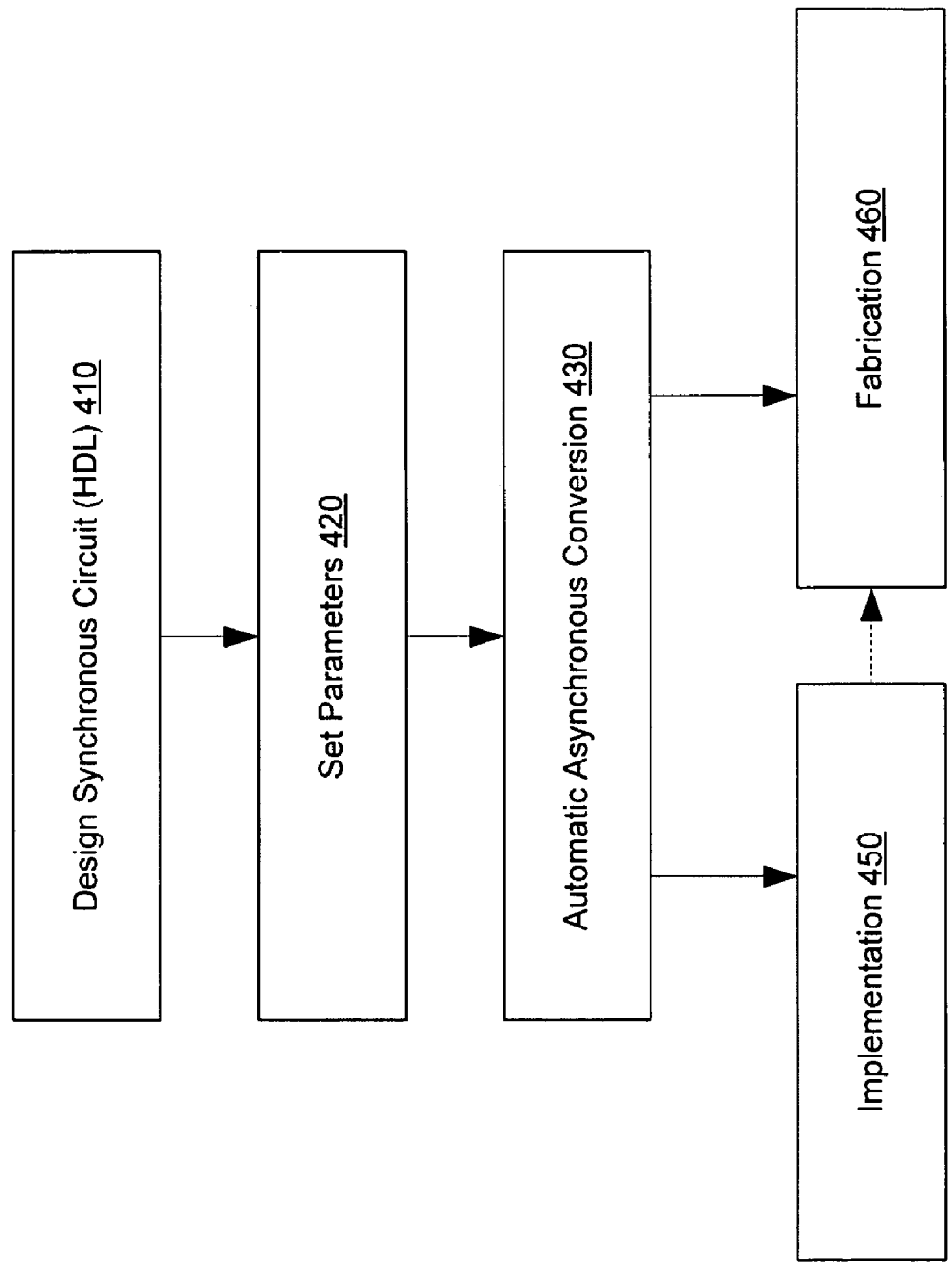
FIG. 4 depicts a flowchart of an asynchronous circuit development process in accordance with an exemplary embodiment.

Referring now to FIG. 4, a flowchart of an asynchronous circuit development process is shown in accordance with an exemplary embodiment. The operations described with reference to FIG. 4 may be implemented by executing asynchronous design application 114. Additional, fewer, or different operations may be performed, depending on the embodiment. The order of presentation of the operations of FIG. 4 is not intended to be limiting. Desynchronization is implemented as a network with data validity (DV-Desync) creating a network with choice, unlike DV-Desync's marked graph counterparts. Choice includes information from both the data path and the control network resulting in an implementation that starts as a clocked design, but is realized with full asynchronous protocols resulting in substantial power improvements.

In an operation 410, a synchronous circuit is designed. In an exemplary embodiment, the synchronous design is encoded in a hardware description language. For example, the hardware description language may be Verilog or any other hardware description language. In an operation 420, parameters for the conversion of the synchronous circuit to an asynchronous circuit are defined or selected. For example, first register 202, second register 204, and third register 206 can be replaced by D-flip-flops, master slave latches, or any other barrier latching structure. Other parameters such as operating voltages, local constraints, different frequencies, and protocol constraints also may be identified. General types of parameters that may be defined or selected include a template set, data validity protocols, local constraint parameters, protocol constraint parameters, timing constraint parameters, etc. The parameters are applied to produce an asynchronous circuit design. In an operation 430, the clocked network is replaced with asynchronous control logic as discussed further with reference to FIG. 5. For example, templates and timing constraints may be applied to generate an asynchronous circuit design in, for example, a hardware description language such as Verilog. In an operation 450, the asynchronous circuit design is implemented for example by loading the design onto a field programmable gate array (FPGA) or an equivalent, which can be verified and tested. In an operation 460, the asynchronous circuit design is translated to a layout for fabrication. Before fabrication, the asynchronous circuit design can be verified in operation 450. The asynchronous circuit design can be mass-produced at a fabrication facility.

Figure 5:
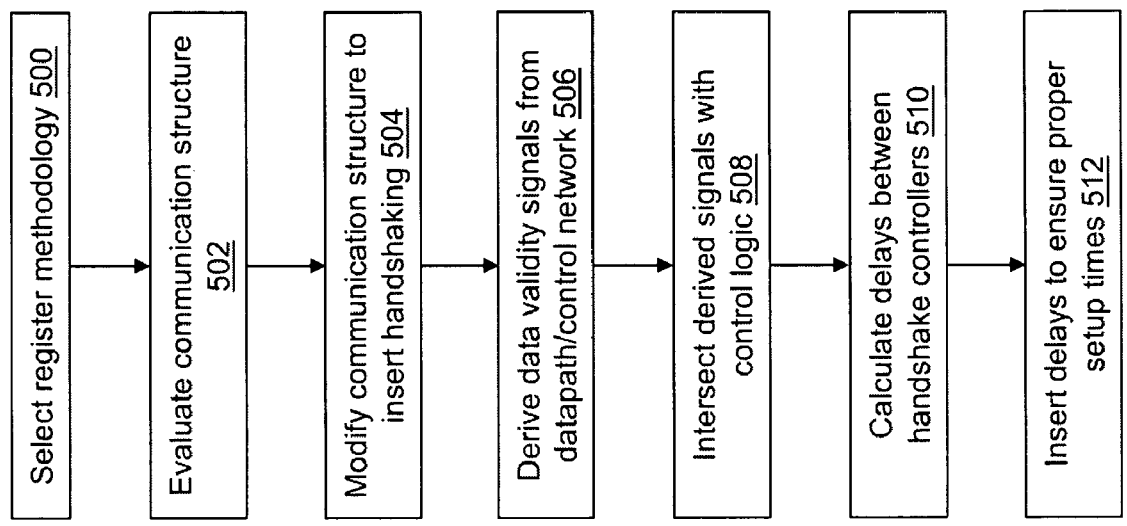
FIG. 5 depicts a conversion process in accordance with an exemplary embodiment.

Referring now to FIG. 5, a flowchart of a conversion process is shown in accordance with an exemplary embodiment. Additional, fewer, or different operations may be performed, depending on the embodiment. The order of presentation of the operations of FIG. 5 is not intended to be limiting. The operations described with reference to FIG. 5 may be implemented by executing asynchronous design application 114. In an operation 500, a register methodology is selected such as that described with reference to FIG. 3. In an operation 502, the pipelined communication structure of the architecture is evaluated. In an operation 504, the pipelined communication structure of the architecture is modified to insert handshake clocking to replace the synchronous clock. Each data path is accompanied with a control path such that handshake controllers are added to drive the clock inputs of the flops/latches. In an operation 506, data validity signals are derived from the datapath and control network. In an operation 508, the derived data validity signals are intersected with the control logic, which can change the basic pipeline structure. Based on the interaction between the adjacent pipeline stages, specific templates may be used to ensure proper functionality of the circuit. In an operation 510, delays between the handshake controllers are calculated based on the cycle time of the clock or the combinational logic delay between two pipeline stages. In an operation 510, the calculated delays are inserted into the handshaking to ensure that proper setup times are maintained.

In an exemplary embodiment, asynchronous design application 114 uses existing computer aided design (CAD) tools and implements data validity. Data validity is a class of protocols that insure valid data with respect to a signaling scheme. Examples of data validity protocols include single rail, two phase; dual rail, four phase, and single rail, four phase, as well as bundling schemes. Data validity protocols also may include an associated set of constraints such as timing constraints. The combination of data validity with handshaking results in choice. Choice occurs wherever there is convergence between data paths across different pipeline stages; consequently, the appropriate handshake control is Inserted. The validity status of the data is extracted from the datapath. The validity information is made available to the control path which either injects, propagates, or consumes data tokens represented by handshake activity in the handshake clocking network. Synchronization information between various stages is explicitly made available to the control path, and is not dependent on implicit cycle counting at the point of convergence. Relative timing is used to capture, model, and validate the heterogeneous timing in the circuit structures.

Figure 7:
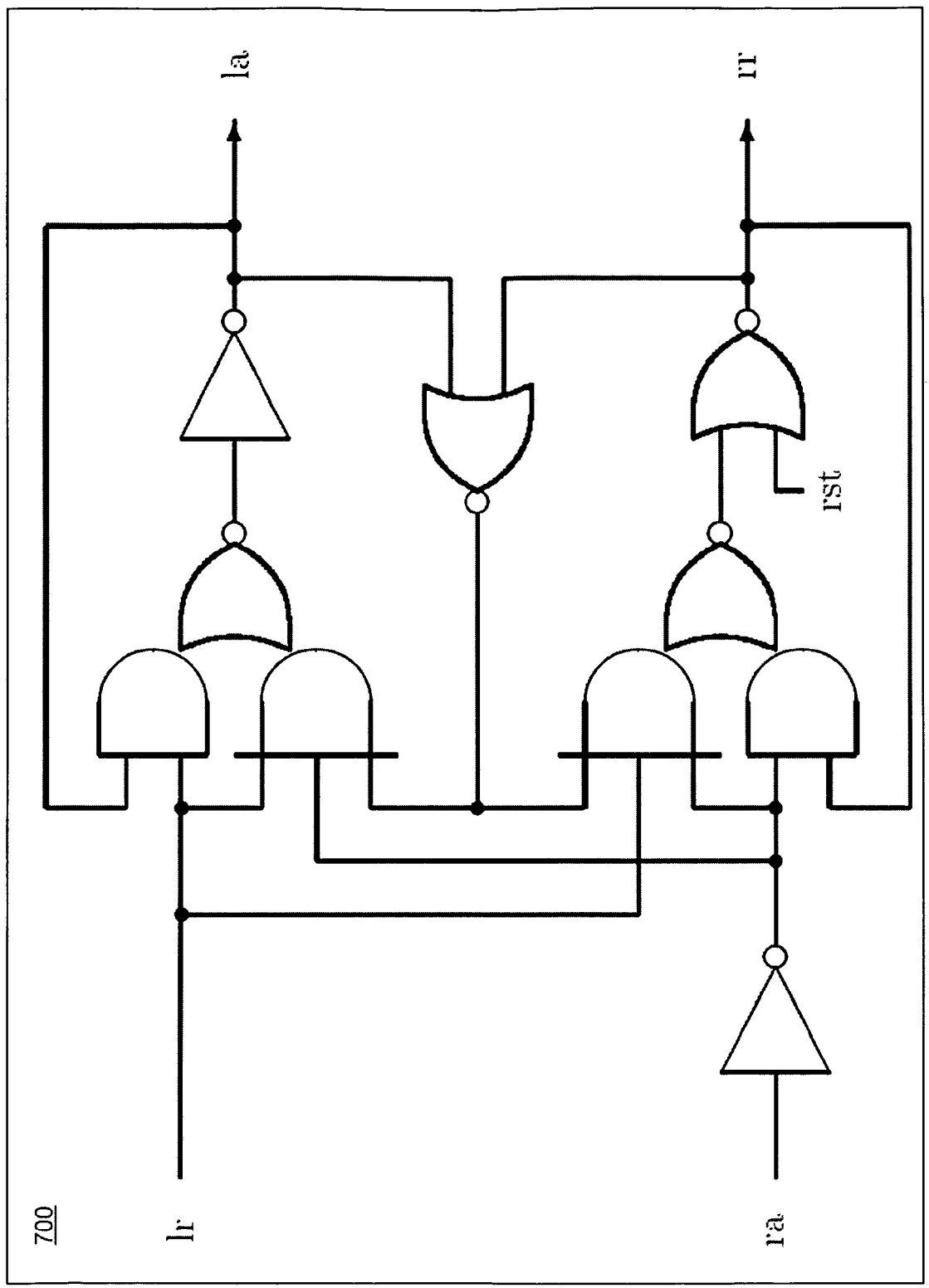
FIG. 7 depicts a circuit implementation of the efficient linear pipeline controller of FIG. 6 in accordance with an exemplary embodiment.

The template set includes a set of individual templates. Each template is a library macro cell that is implemented into the design flow to replace the clock tree. For example, the template set may include: (a) a specification 600 of the protocol implemented by each template implementation, as shown in FIG. 6; (b) a circuit realization 700 implemented as a sequential asynchronous controller as shown in FIG. 7; and a hardware description language (HDL) implementation 800 of a sequential asynchronous controller as shown in FIG. 8. Templates can be implemented using various synthesis tools as well as custom design.

The templates contain characterization information for timing and timing driven optimization. The relative timing properties of each template may be expressed in synopsys design constraint (.sdc) format. Relative timing enables accurate capture, modeling, and validation of heterogeneous timing in general circuit structures. Timing constraints are made explicit in designs, rather than using traditional implicit representations such as a clock frequency to allow designers and tools to specify and understand the implications and to manipulate the timing of more general circuit structures and advanced clocking techniques. Timing constraints that affect the performance and correctness of a circuit are transformed into logical constraints, rather than into the customary real-valued variables or delay ranges to support a compact representation and allow more efficient search and verification algorithms to be developed which greatly enhance the ability to combine timing with optimization, physical placement, and validation design tools. As a result, the way in which timing is represented by designers and CAD tools is altered, and has been shown to provide significant power-performance advantages in some circuit designs.

In an exemplary embodiment, the timing constraints are represented as logical expressions that make certain states unreachable. The full set of timing conditions are explicitly represented for the design in the logical and behavioral domain. The timing constraints are generated for both the handshaking control and a complete system that includes the datapath, function units, and storage elements. For example, the timing constraints that hold for the template to operate properly are shown in FIGS. 12-14 and 26. The timing constraints can be represented in two forms: relative constraints, "set data check" constraints; and absolute constraints, "set min delay" and "set max delay" constraints. FIG. 12 includes key timing driven constraints 1200. FIG. 13 includes external protocol constraints 1300. FIG. 14 includes wire fork constraints 1400. The timing constraints are constructed to ensure that the full relevant circuit and point-of-divergence (POD) to point-of-convergence (POC) timing paths can be evaluated. The timing paths are consistent with the clock domains such that the full POD to POC constraints are in a single clock domain. The POD is assumed to be the clock. The timing paths are consistent with loop cutting so that the relevant POD to POC paths are not cut.

Two additional timing constraint classes 2600 are provided in FIG. 26. A bundled data methodology is employed when traditional clocked datapath logic is sequenced using asynchronous control logic. The logic of FIG. 1 is verified using the protocol for the controllers and latches and delays for the datapath to verify the constraints. The first class is a set of delays ensuring the data is valid at the latch inputs before the clock signal is generated from the asynchronous templates. The second set of constraints exist when the template is a timed protocol, as is the case with the linear controller.

In an exemplary embodiment, with reference to FIG. 15, a reporting statement 1500 for each constraint can be generated to ensure that it the timing paths are implemented properly and that the correct margins hold.

As a result, the asynchronous templates can be correctly optimized along with the synthesized data path logic in the design flow resulting in a powerful clocked CAD tool flow that takes clocked datapath logic and asynchronous sequential templates to synthesize and optimize asynchronous systems with handshake clocking. In general, the circuit realization in the template is not modified through synthesis or place and route flows. However, templates can be optimized for power and performance constraints. For example, as shown in. FIG. 9, a template can be optimized for power and performance when using the Synopsis CAD library by making the template have "size only" constraints 900 in the design in order to limit the relative gate placement of a cell.

In an exemplary embodiment, there are three classes of templates that can be designed. A first template class controls the latches. For example, the linear pipeline control circuit of FIG. 7. A second template class implements choice in the network. This second template class can interface with the data path and either produces or consumes data validity tokens. The second template class reduces power because handshakes are only asserted when necessary (data is valid). A third template class implements the pipeline structure and flow of data between latches. The third template class does not control the latches, but steers data validity tokens based on the pipeline structure. The second and third template classes can be separate or combined for efficiency.

The template designs may be characterized based on the specific cell library being used for the implementation. As processes scale, the characterization changes if the function of the gates is modified because new hazards can be introduced if a logic function is decomposed into a different set of gates or cells in a library. When the hazard properties change, so do the timing constraints. Once the template has a specification and technology mapped implementation, the templates use formal verification to prove conformance to the protocol and generate the timing constraints. The templates may be formally characterized for their relative timing constraints and turned into directed acyclic graph (DAG). Because the technology mapping remains fixed for the template, the "size only" constraint is used throughout the synthesis and place and route flows to allow the cells to be optimized for power and performance as long as an identical function is employed.

The templates are characterized for correct behavior and timing using formal verification between the template protocol and its implementation. The formal specification of the template protocol may be expressed in the calculus of communicating systems (CCS), or using other formalisms, such as signal transition graph, temporal logics, etc. The Verilog implementation of the template is verified against the specification to create provably correct relative timing conditions that hold so the circuit operates correctly in any timing environment. The cyclical implementation and protocol behavior are broken into a DAG for clocked CAD support, and the key relative time (RT) constraints are fully contained in the DAG. Further, the structure of the templates cannot be modified by the flows, so the template designs are characterized as size-only primitives. These constraints sufficiently characterize the design to enable correct design and validation using timing driven CAD.

A set of constraints that break the structural timing cycles of the template are shown in FIGS. 10 and 11. For example, the local constraint parameters 1000 and protocol constraint parameters 1100 may be used to break the structural timing of the templates. The local constraint parameters 1000 break the local cycles in the sequential circuit and should be judiciously defined in a manner that supports the timing of the design. FIG. 10 shows an example of using "set_disable_timing" to include feedback loops in the design. For example, in a Mealy state machine, these are the y-state variables. The protocol constraint parameters 1100 produce cycles between the templates based on the request/acknowledge channel handshake protocol specification. These cycles are broken in a manner that supports the implementation of the particular handshake protocol.

Figure 16:
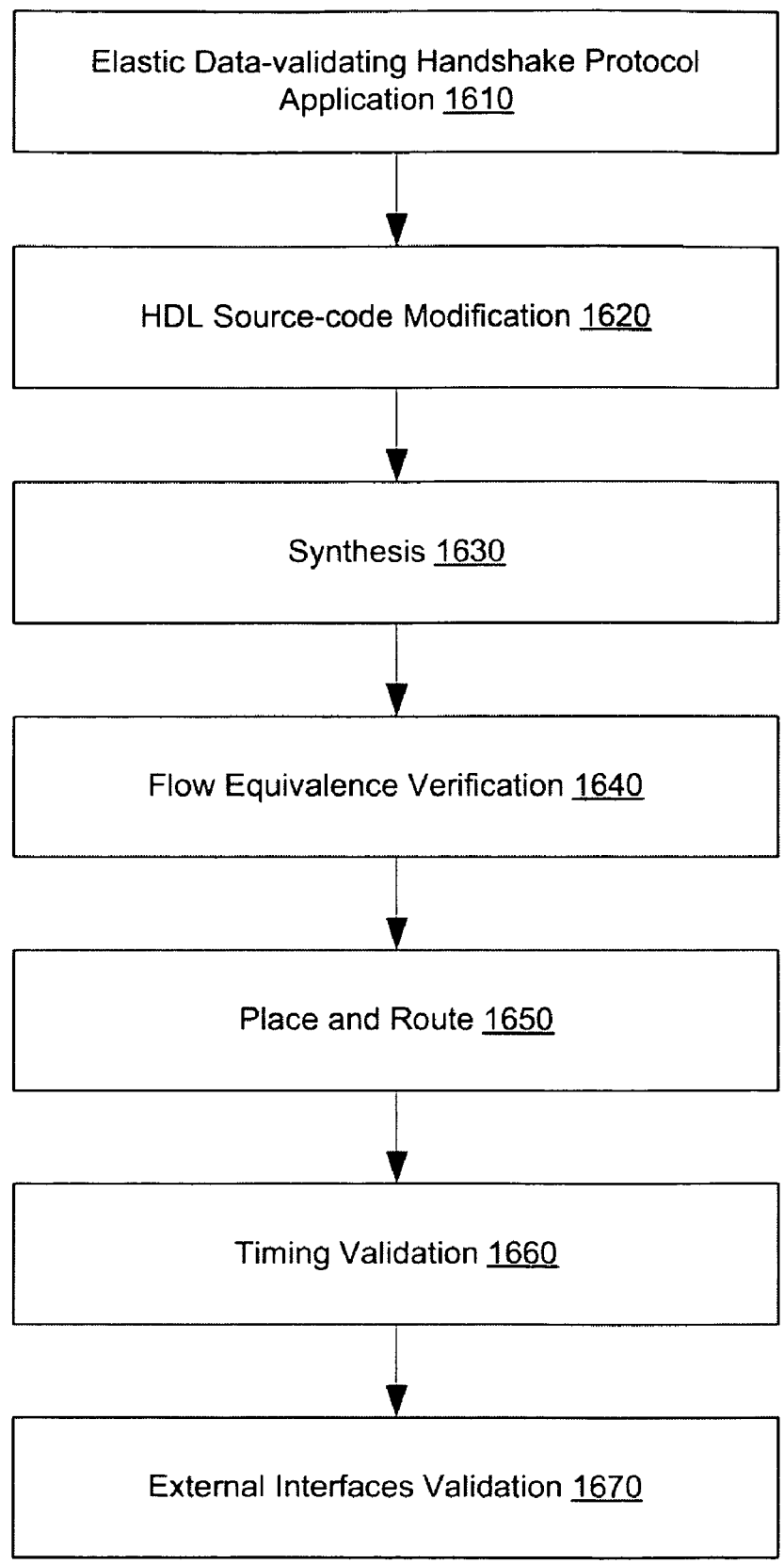
FIG. 16 depicts a flow chart of the operation of the asynchronous converter in accordance with an exemplary embodiment.

With reference to FIG. 16, a flow chart of the operation of the asynchronous converter 1600 is shown in accordance with an exemplary embodiment. Additional, fewer, or different operations may be performed, depending on the embodiment. The order of presentation of the operations of FIG. 16 is not intended to be limiting. The operations described with reference to FIG. 16 may be implemented by executing asynchronous design application 114 which may operate with and parallel to traditional CAD tools. For example, asynchronous design application 114 can provide input to a CAD tool, process output from a CAD tool, or act as an add in. Advantageously, asynchronous design application 114 works with existing CAD tools rather than attempting to replace them.

In an operation 1610, the HDL code of the clocked network of the synchronous circuit design is altered with high-level design descriptions of asynchronous components. The high-level design descriptions may be expressed in Verilog. The high level Verilog is modified to use the handshake clocking templates rather than a periodic clock resulting in structural modifications. Frequency requirements from the clock domains that are particular to the implementation are mapped to particular relative timing constraints in the characterized library. The methodology allows multiple frequencies to interact if the design allows. For example, the registers are identified and included in the synchronous circuit design and replaced as described above with reference to operation 500. A handshaking template is applied between successive registers.

Data validity is implemented in the data path. For example, when a fork or join is identified, the synchronous circuit design is altered by applying a data validity protocol to the respective datapaths. As an example, the data validity protocol may implement a single rail, four phase protocol. The data validity protocol also includes changes to the associated constraints such as timing constraints of the data-validity datapath. The data protocol can be integrated with the handshake protocol to reduce the implementation circuitry.

In an operation 1620, the source code of the synchronous circuit design is decoupled from the clocked network in order to desynchronize the design. These transformations can include replacing clocked statements such as "always @(posedge clk)" with new clocked template calls. Alternatively, where a gated-clock methodology is employed, the clock network source code may be modified appropriately. The Verilog is now expressed as an asynchronous circuit that can be directly synthesized, place and routed, and validated post-layout through the traditional CAD flows.

In an operation 1630, the synthesis tools of existing CAD packages process the source code using the timing constraints, local constraint parameters, and protocol constraint parameters to generate an asynchronous circuit design. Synthesis can be done in one pass; however, iteration can improve the output circuit's performance. The asynchronous converter assists the CAD tools by suggesting changes during the synthesis process. Timing driven synthesis requires a timing model for the system that is a DAG based on the structure of the circuit.

In an operation 1640, the original synchronous circuit design is compared to the altered asynchronous circuit design to prove flow equivalence. Existing CAD tools may be used to evaluate the circuits. In an operation 1650, the timing constraints, local constraint parameters, and protocol constraint parameters are used to generate an asynchronous circuit layout. The layout can be for a programmable device such as an FPGA or for production of a mask set to be used in fabrication. Existing CAD tools may be used to evaluate the circuits. Asynchronous design application 114 may assist the CAD tools by suggesting changes during execution of operation 1650.

Place and route tools may use a timing model for the system that is a DAG based on the structure of the circuit. In an exemplary embodiment, the handshake templates are cyclic graphs for two reasons: the handshake protocols have cyclic timing requirements, and the physical design implements sequential logic with feedback. These sequential systems are broken into compatible DAGs where all essential timing constraints for timing driven synthesis are represented. The formal verification flows use relative timing to formally prove correctness and completeness of the timing constraints.

In an operation 1660, the result of operation 1650 is simulated and formally verified using existing CAD tools. A relative timing approach is employed. A full set of timing constraints is used in the design process where all device and wire delays are allowed to vary from zero to infinity. The design process utilizes a formalism called delay insensitive design. Many of the timing constraints are not necessary for synthesis and place and route, such as conservative delays or those that arise from a local wire fork. However, such timing requirements are represented and implemented in the post-layout validation to ensure correctness and control commercially defined circuit yields.

In an operation 1670, the operation of the asynchronous design is simulated with other circuits that interface with the asynchronous design. External interface validation allows a designer to determine if additional synchronization circuitry is needed on either side of an interface. Desynchronization with data validity results in designs that may or may not be able to communicate with clocked systems without synchronization. Desynchronization using data validity may not result in a fully synchronized interface between clocked systems. Certain clocked interfaces to the desynchronization using data validity systems can occur without synchronization, but others will not. For example, a slave port that is only a consumer of data in a pipeline needs no synchronization, but a master or input/output interface may need to be synchronized to a clock. This is due to the skew that can occur when a clocked circuit is desynchronized and handshakes do not occur every clock cycle. After an asynchronous circuit design is validated for its external interfaces, the design is ready for production.

Desynchronization with data validity can be demonstrated through asynchronous sequential templates. The first template, a simple linear pipeline controller, is demonstrated showing the complete characterization that supports synchronous CAD tools. Two more templates are demonstrated showing a diversity of control structures. Finally, the design of a simple MIPS microprocessor is shown as an example of desynchronization.

Figure 22:
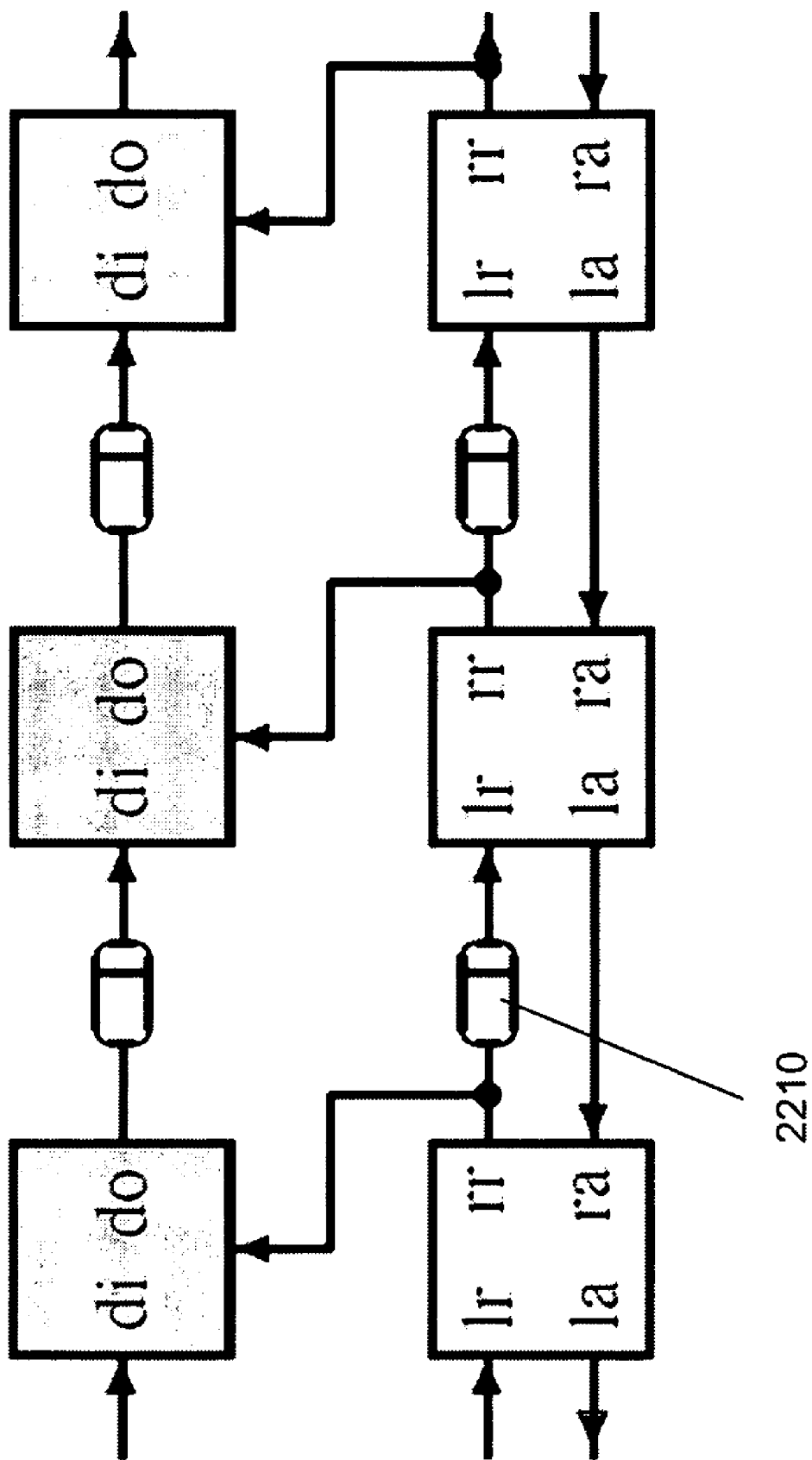
FIG. 22 depicts a linear pipeline handshake clock controller and datapath in accordance with an exemplary embodiment.
Figure 23:
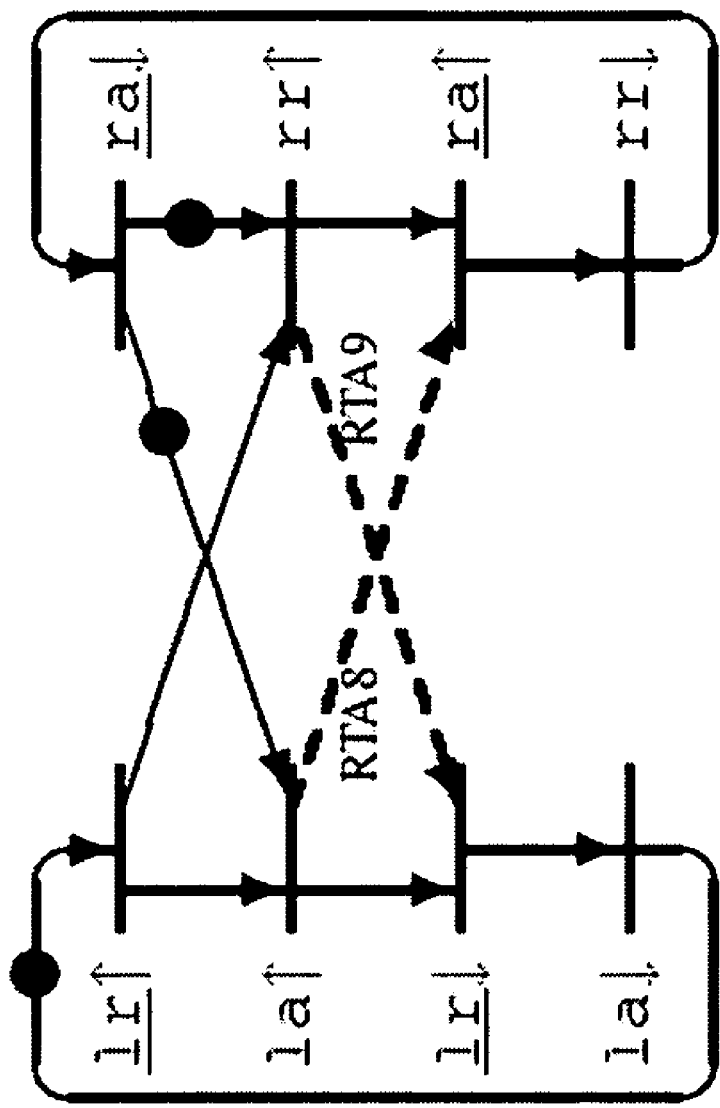
FIG. 23 depicts a Petri net specification of a linear control in accordance with an exemplary embodiment.

The simplest of all handshake protocols is the linear pipeline control protocol that is interconnected to the datapath as shown in FIG. 22. Data is stored locally upon receiving a request, and the data is passed down the pipeline. The specification is shown in FIG. 6 using the CCS process language and a Petri net as shown in FIG. 23. A CCS process may carry out a serial sequences of actions (using .), choose non-deterministically from several courses of actions (using +), or run in parallel and synchronize with another agent (using |). Parallel agents synchronize by communicating when shared labels are used (c1 and c2). A communication can occur when an action is an input to one agent and an output to another, and both are enabled. When a signal is hidden (syntactically via \{}), the communication becomes local to those agents. The communication signals between the processes create barrier synchronization so that neither process LEFT or RIGHT can proceed until the synchronizations occur.

Templates in this example may use a four-cycle return to zero handshake protocol. This can be seen by observing the LEFT and RIGHT processes of FIG. 6. These agents sequentially communicate along the left and right channel first accepting (asserting) the left request lr (rr), followed by asserting (accepting) the acknowledgment la (ra), and repeating the sequence to get back to the original voltage in a digital circuit. Four-cycle protocols typically result in circuit designs that are smaller and faster than their two-cycle counterparts due to the voltage level logic, rather than transition logic. The implementation of this circuit, mapped to a simple complex gate library such as the Artisan or TSMC cells is shown in FIG. 7.

The controller can be technology mapped to the implementation as shown in FIG. 8 for the Artisan 130 nm cell library. The asynchronous templates apply the size_only property to prevent remapping of the gates which can change the hazard properties. This is the first set of constraints that characterize the template. FIG. 9 shows the property set for all gates; however the property normally is not necessary for simple gates such as inverters or NOR and NAND gates constrained by a set of more complex AND-OR-Invert gates, as the NOR in this circuit.

The conformance relationship based on bisimulation semantics between the implementation of FIG. 7 and the specification in FIG. 6 is shown in FIG. 24. This formal relationship may be implemented as an asynchronous CAD program. The tool verifies the behavior of a module, augmented by relative timing constraints, and conforms to the specification using bisimulation semantics. The relative timing constraints are expressed as a point-of-divergence that sources two paths that merge again in a point-of-convergence. FIG. 25 shows a relative timing constraint expressing the timing that exists in a typical clocked design. The data launched from rising clock edge i arrives at the flops before clock edge i+2 (the next rising clock). The constraint is generated by formal verification applying a logic conformance relationship in RT-FV box 2510, and timing constraints are generated and mapped to the format acceptable for CAD tools, as represented by static timing analysis (STA) block 2512.

The conformance relationship is applied using either speed-independent semantics, where arbitrary delays are assigned to the logic gates, or a delay-insensitive semantics where arbitrary delay is assigned to both gates and all wire segments. By applying formal verification using logic conformance on the design a set of relative timing constraints can be created. FIGS. 12-14 show a complete set of constraints, generated for the circuit of FIG. 7, that have been mapped to Synopsys .sdc constraints. The constraints can be broken into three sets. The first two sets use speed-independent semantics where only unbounded logic gate delays are evaluated. A first set 1200 of constraints, called key timing driven constraints, can be optimized through the CAD tools for timing driven place and route to ensure correct timing in the design. First set 1200 provide local feedback of the state variable that run from the outputs through the NOR gate. A second set 1300 of constraints are external protocol level constraints that exist because the circuit implements a timed protocol. Second set 1300 typically does not need to be included in the synthesis and place and route flows due to the magnitude of the slack in the race paths. The long path for these delays goes through a delay element 2210 shown with reference to FIG. 22. A third set 1400 of constraints, the wire fork constraints, result from the delay-insensitive model. Third set 1400 checks for variation in signal arrival times due to large variances on wire signal paths. Second set 1300 and third set 1400 are not needed to drive timing driven place and route, but only to validate correctness of the final post-layout design.

Figure 19:
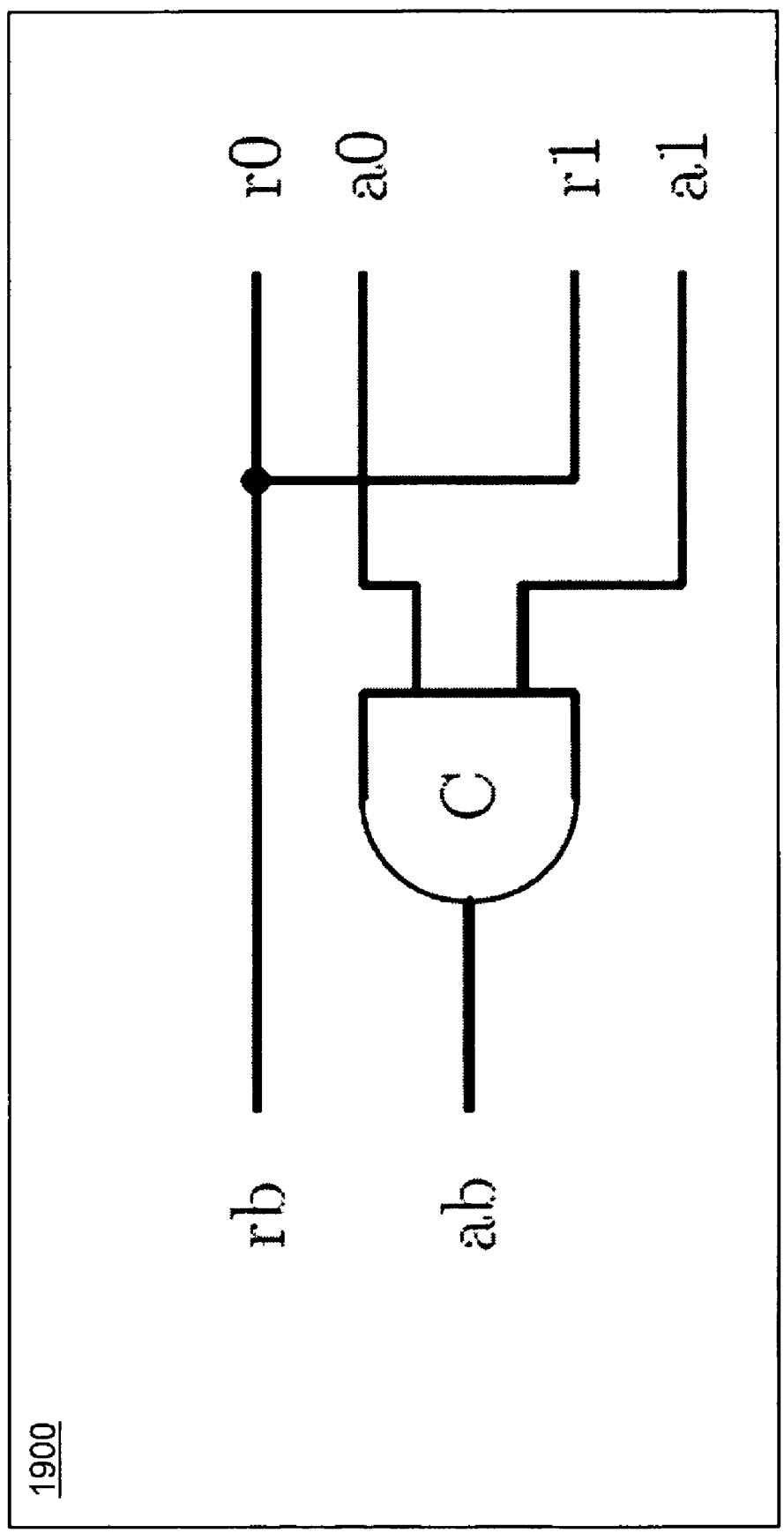
FIG. 19 depicts a template that executes broadcast communication and barrier synchronization in accordance with an exemplary embodiment.

The second template class implements data validity steering in the design. The traditional data validity in a desynchronized design uses a "broadcast" semantics, where all inputs are required to occur and all output branches are driven each cycle. This may be implemented using a fork/join controller where all outgoing branches are implemented with a forked broadcast, and all inputs occur as the synchronization before continuing. FIG. 19 demonstrates a fork/join template 1900. There are many published c-element designs with various timing that could be used for this implementation. Fork/Join template 1900 is a standard template used in desynchronization and requires no integration with the data path due to its broadcast semantics. The operation of fork/join template 1900 is a broadcast fork or join based on which interface initiates transactions.

Figure 20:
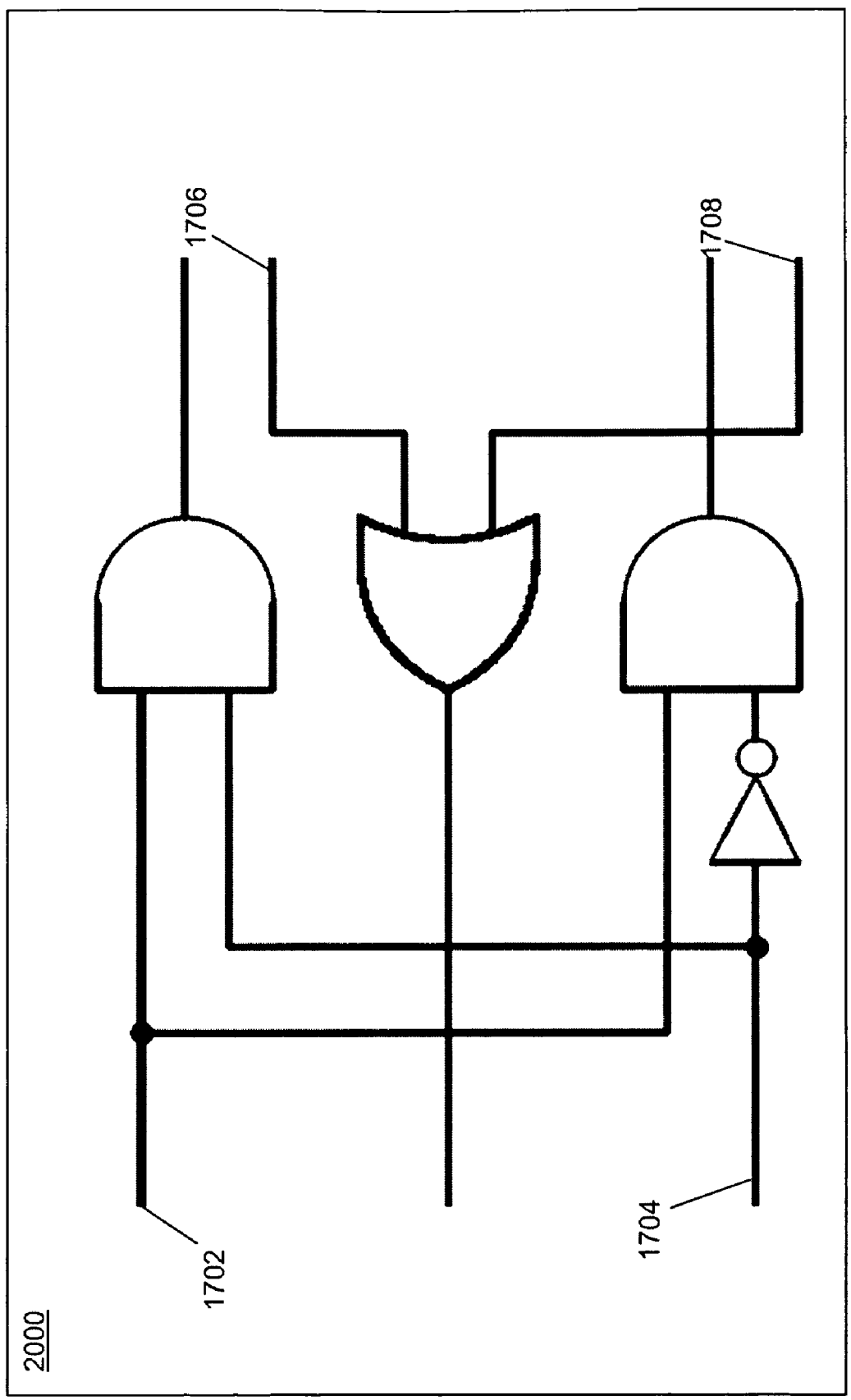
FIG. 20 depicts a template that steers handshaking selectively to one of two destinations in accordance with an exemplary embodiment.

A route/merge template 2000 is shown in FIG. 20. Rather than broadcast the requests to multiple recipients, route/merge template 2000 routes a request to a single destination and waits for the handshake on that channel. Route/merge template 2000 reduces power in a design because only a single data pipeline is enabled. Route/merge template 2000 uses information from the data path to implement the steering of the data. Thus, there are two different classes of signals: the control handshake signals that move between templates, and signals that interface between the datapath and the templates. The sel signal 1704 interfaces with the datapath to control data steering. Route/merge template 2000 implements a route or merge operation based on which interface initiates transactions. Data flow is left to right if rm 1702 is the first action, or from right to left if r0 1706 or r1 1708 is the first action starting the four cycle handshake. Route/merge template 2000 is used in the "Select" blocks in a MIPS control pipeline as well as in most of the wire joins. The timing of route/merge template 2000 is such that the select becomes stable before rm and remains stable until rm lowers. Thus, the transition of sel is changed mutually exclusively to the control signals in route/merge template 2000.

Figure 21:
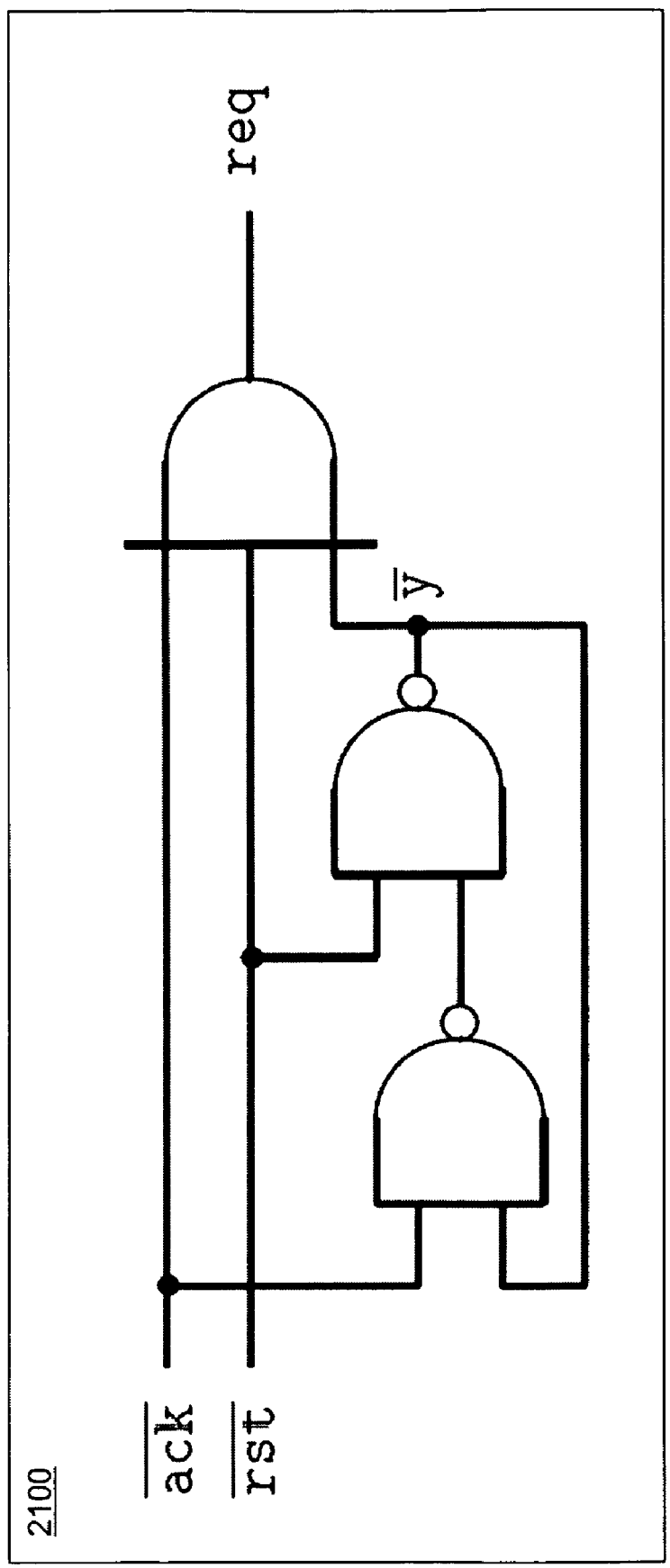
FIG. 21 depicts a template that injects one token into the network graph in accordance with an exemplary embodiment.

The third template class produces or consumes tokens in the structural pipeline of the design. A reset template 2100 used for this purpose in a MIPS design is shown in FIG. 21. Reset template 2100 is an implementation of a "Reset Block." Initially, the linear pipeline controllers are reset to the empty state. The controller injects a single request into the system, creating a branch target to the first instruction in the processor's instruction stream. Reset template 2100 is an example of a token producing template that takes the system from a state without any valid tokens to one valid token. The valid token continues to cycle through the pipeline until the system is reset again. Other such blocks can produce or consume tokens each time they are activated.

Figure 17:
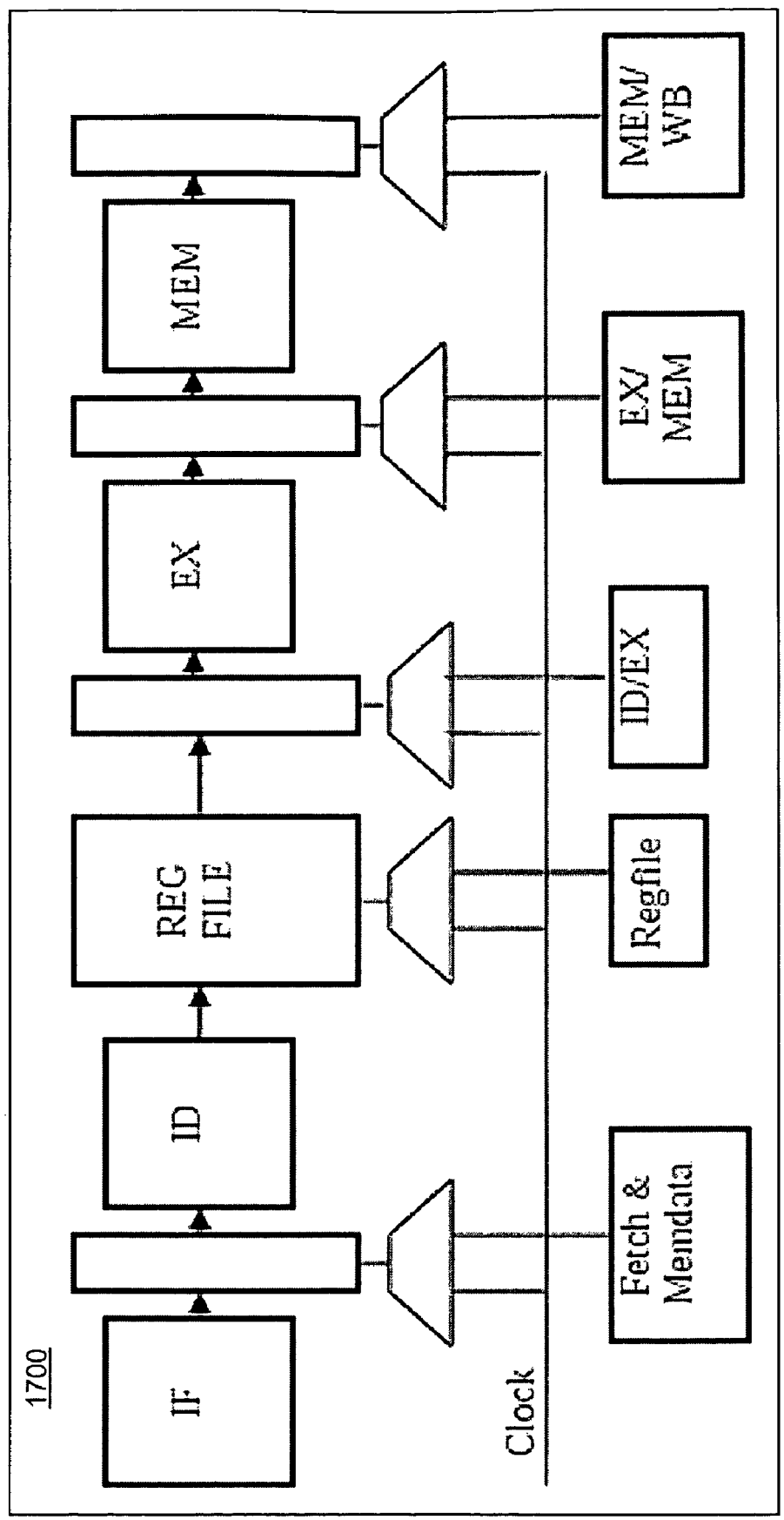
FIG. 17 depicts a simple microprocessor without interlocked pipeline stages in accordance with an exemplary embodiment.

The desynchronization of a simple microprocessor without interlocked pipeline stages (MIPS) microprocessor is described. MIPS is a reduced instruction set computer (RISC) microprocessor architecture. A MIPS microprocessor with four pipeline stages was used for implementing the desynchronized system. With reference to FIG. 17, a MIPS clocked pipeline structure 1700 is shown. The MIPS processor was desynchronized to save power using the methods and templates described above. The templates use a four-cycle return to zero handshake protocol which simplifies the data steering and token production and consumption templates. The select blocks send the valid data either to the top pipeline or the bottom pipeline, depending on interaction with the datapath (in this case the control state of the central processing unit). The processor blocks were synthesized with the SDC using the Artisan 130 nm library.

Figure 18:
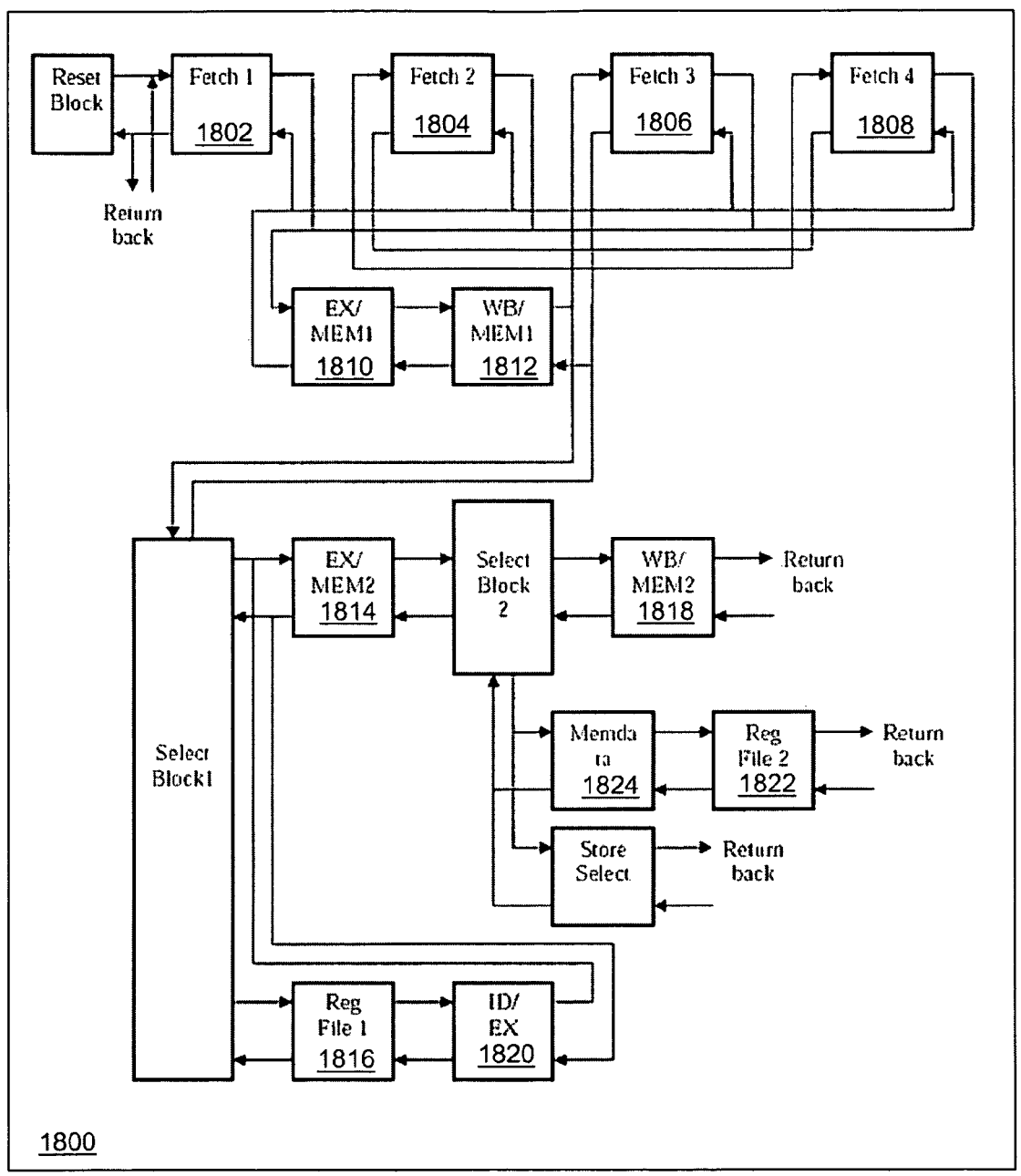
FIG. 18 depicts a low power microprocessor without interlocked pipeline stages pipeline structure with data validity in accordance with an exemplary embodiment.

FIG. 18 shows the implementation of a desynchronized part of the MIPS microprocessor. A desynchronized processor 1800 centers on the controller state. Each decision is taken based on the controller's current state and, at the end, the current state of the controller is updated. The instruction fetch operation is a four fetch cycle operation to generate a 32 bit instruction. The new instruction data is loaded into fetch registers 1802-1808 and in parallel a program counter is also updated using a series implementation of a first fetch register 1802, EX/MEM1 block 1810, and WB/MEM1 block 1812. In this example, EX/MEM1 block 1810 and WB/MEM1 block 1812 act as a common block for all the cycles of the fetch registers 1802-1808, and thus, are reused. The fetch instructions may be mutually exclusive to avoid a system stall. In this example, the EX/MEM1 block 1810 also updates the controller, which updates the current state of operation.

After the fetch operation, depending on the instruction, either the EX/MEM2 block 1814 gets charged for the instruction execution or the Regfile1 block 1816. If the instruction is a Jump instruction, then EX/MEM2 block 1814 receives a left request which is forwarded to the WB/MEM2 block 1818 and back to Fetch1 block 1802. For all other instructions, the Regfile1 block 1816 receives the request. For Register type instructions, the Regfile1 block 1816 is activated first, after which ID/EX block 1820 receives a left request. ID/EX block 1820 passes the request to EX/MEM2 block 1814 and then to Regfile2 block 1822 which forwards it back to first fetch register 1802.

For a load instruction, EX/MEM2 block 1814 forwards the request signal to Memdata block 1824 if a memory read signal is enabled, which forwards the request signal to Regfile2 block 1822 and back to first fetch register 1802. For a store instruction, the EX/MEM2 block 1814 forwards the request back to first fetch register 1802 if a memory write signal is enabled.

The forks and joins may be implemented based on the type of signals received. If the signals were mutually exclusive then a simple OR gate may be used for joins for request signals. For example, the request signals received from fetch registers 1802-1808. For forks, an AND gate or a C-element may be used depending on the type of selection signal. If the selection signal remains the same throughout the Instruction execution, an AND gate may be used; while for state based selection signals, a C-element may be used. For example, the instruction selection is done based on the Instruction27 pin, which remains high throughout the instruction execution time, so an AND gate is used to select the branch activated from the fork. Similarly, for selection between fetch registers 1802-1808, a C-element may be used with one of the inputs as the state when it should be active.

In this simple example, the performance of the desynchronized MIPS processor and the synchronized MIPS processor are nearly the same. However, the dynamic power consumption of the desynchronized MIPS processor is less than the dynamic power consumption of the synchronized MIPS processor. Switching registers form a major chunk of the dynamic power consumption of any system. In the synchronous version, all the registers of the Register file (i.e. 64 registers) and also the non-active pipeline stages, switch every clock cycle over and above the active stage. In the desynchronized version only the active registers switch.

Advantageously, the implementation of the desynchronized MIPS processor is realized with full asynchronous protocols resulting in substantial power improvements. This system and method, when connected to an asynchronous network fabric using a globally asynchronous locally synchronous design flow, supports overhead free synchronization and integration of circuit blocks even when operating at different frequencies and potentially different voltages. In addition, the asynchronous design system largely utilizes traditional synchronous CAD as provided by the CAD vendors to create asynchronous circuit design using a "desynchronization" design flow. Designers can create fully asynchronous circuits using traditional clocked mentality and design tools.

Timing driven synthesis and design validation is a primary impediment to the process of converting a clocked design into an asynchronous realization through the desynchronization process. A method of formally proving the necessary timing constraints and mapping them to traditional clocked design flows is the foundation of successfully desynchronizing a design. This flow, based on relative timing, supports direct and automatic characterization of asynchronous templates in a manner that can be fully supported by the clocked CAD flows.

The following steps can be used to convert clocked circuit designs into energy-efficient designs with desynchronization adding data validity. Asynchronous circuit templates are characterized with relative timing and the timing information is converted into a format supported by commercial clocked CAD. The clocked network is removed and replaced with the asynchronous circuit templates by modification of the data path to include steering templates and controllers that follow each data path. Interaction between the data path and controllers is implemented to introduce data validity information into the protocols.

The following steps can be used to characterize the asynchronous templates into a format that is supported by commercial clocked CAD. The behavior of the asynchronous templates may be formally specified for example as shown in FIGS. 6 and 23. The asynchronous template is designed and implemented as a module for example as shown in FIGS. 7 and 8. The template cells are restricted from logic modification through constraints such as those shown in FIG. 9. The template is verified for example as shown in FIG. 25 to create a set of relative timing constraints. The relative timing constraints used for correct timing driven implementation and verification are translated into timing constraints supported by the clocked CAD tools for example as shown in FIGS. 12-14 and 26. The relative timing constraints can be validated as correctly implemented in the commercial CAD tools with timing reports such as those shown in FIG. 15. Cycles in the circuit may be broken to create a timing DAG that supports the relative timing constraints and automatic sizing, as shown in FIGS. 10 and 11. Clocks are defined through the asynchronous templates in such a way that all paths lie on a clock signal represented as a DAG. Based on this process, the templates are fully characterized and can run through synthesis and validation flows of a clocked design.

The word "exemplary" is used herein to mean serving as an example, instance, or illustration. Any aspect or design described herein as "exemplary" is not necessarily to be construed as preferred or advantageous over other aspects or designs. Further, for the purposes of this disclosure and unless otherwise specified, "a" or "an" means "one or more". The exemplary embodiments may be implemented as a method, apparatus, or article of manufacture using standard programming and/or engineering techniques to produce software, firmware, hardware, or any combination thereof to control a computer to implement the disclosed embodiments.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The functionality described may be implemented in a single executable or application or may be distributed among modules that differ in number and distribution of functionality from those described herein. Additionally, the order of execution of the functions may be changed depending on the embodiment. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for designing an asynchronous integrated circuit, the method comprising:
    replacing a global clock network of a synchronous circuit with a plurality of handshaking circuits;
    encoding, with a computing device, data validity into a communication path between a first pipeline stage and a second pipeline stage of the synchronous circuit; and
    implementing a control logic for the first pipeline stage using a template that contains characterization information for timing to generate an asynchronous circuit design.

2. The method of claim 1, wherein the data validity is encoded using a protocol, wherein the protocol comprises at least one of a single rail using a two phase protocol, a dual rail using a four phase protocol, and a single rail using a four phase protocol.

3. The method of claim 1, further comprising characterizing an asynchronous circuit design using a relative timing methodology.

4. The method of claim 1, wherein the template is represented as a directed acyclic graph.

5. The method of claim 1, wherein the template is a library macro cell.

6. The method of claim 1, wherein the template includes a circuit realization.

7. A non-transitory computer-readable medium including computer-readable instructions stored therein that, upon execution by a processor, cause a computing device to:
    replace a global clock network of a synchronous circuit with a plurality of handshaking circuits;
    encode data validity into a communication path between a first pipeline stage And a second pipeline stage of the synchronous circuit; and
    implement a control logic for the first pipeline stage using a template that contains characterization information for timing to generate an asynchronous circuit design.

8. The non-transitory computer-readable medium of claim 7, wherein the data validity is encoded using a protocol, wherein the protocol comprises at least one of a single rail using a two phase protocol, a dual rail using a four phase protocol, and a single rail using a four phase protocol.

9. The non-transitory computer-readable medium of claim 7, wherein the computer-readable instructions further cause the computing device to characterize an asynchronous circuit design using a relative timing methodology.

10. The non-transitory computer-readable medium of claim 7, wherein the template is represented as a directed acyclic graph.

11. The non-transitory computer-readable medium of claim 7, wherein the template is a library macro cell.

12. The non-transitory computer-readable medium of claim 7, wherein the template includes a circuit realization.

13. A device comprising:
    a processor, and
    a non-transitory computer-readable medium including computer-readable instructions stored therein that, upon execution by the processor, cause the device to replace a global clock network of a synchronous circuit with a plurality of handshaking circuits;
    encode data validity into a communication path between a first pipeline stage and a second pipeline stage of the synchronous circuit; and
    implement a control logic for the first pipeline stage using a template that contains characterization information for timing to generate an asynchronous circuit design.

14. The device of claim 13, wherein the data validity is encoded using a protocol, wherein the protocol comprises at least one of a single rail using a two phase protocol, a dual rail using a four phase protocol, and a single rail using a four phase protocol.

15. The device of claim 13, wherein the computer-readable instructions further cause the device to characterize an asynchronous circuit design using a relative timing methodology.

16. The device of claim 13, wherein the template is represented as a directed acyclic graph.

17. The device of claim 13, wherein the template is a library macro cell.

18. The device of claim 13, wherein the template includes a circuit realization.

* * * * *

UNITED STATES PATENT AND TRADEMARK OFFICE
CERTIFICATE OF CORRECTION

| | | |
|---|---|---|
| PATENT NO. | : 8,065,647 B2 | Page 1 of 1 |
| APPLICATION NO. | : 12/253489 | |
| DATED | : November 22, 2011 | |
| INVENTOR(S) | : Kenneth S. Stevens | |

It is certified that error appears in the above-identified patent and that said Letters Patent is hereby corrected as shown below:

IN THE CLAIMS

Column 15, Line 40, Claim 7, please delete "stage And" and insert --stage and--.

Column 16, Line 18, Claim 13, please delete "processor," and insert --processor;--.

Signed and Sealed this
Twenty-eighth Day of August, 2012

David J. Kappos
*Director of the United States Patent and Trademark Office*